Feb. 23, 1965 C. A. R. KAGAN 3,170,810

METHODS OF AND APPARATUS FOR FORMING SUBSTANCES ON PRESELECTED AREAS OF SUBSTRATES

Filed May 24, 1962

INVENTOR
C. A. R. KAGAN

BY R. Y. Peters

ATTORNEY 3,170,810
Patented Feb. 23, 1965

1

2

3,170,810

METHODS OF AND APPARATUS FOR FORMING SUBSTANCES ON PRESELECTED AREAS OF SUBSTRATES

Claude A. R. Kagan, Pennington, N.J., assignor to Western Electric Company, Incorporated, New York, N.Y., a corporation of New York Filed May 24, 1962, Ser. No. 197,394
5 Claims. (Cl. 117—38)

This invention relates to methods of and apparatus for forming substances on preselected areas of substrates. More particularly, this invention relates to methods of and apparatus for depositing electrically conductive metals on preselected areas of insulating substrates.

In the past, printed circuit components have been fabricated for use in microcircuitry by positioning a mask, having apertures corresponding to the configuration of the desired component, on an insulating substrate. The substrate having the mask positioned thereon is then placed in a vacuum evaporating or vacuum sputtering chamber and an electrically conductive metal is deposited through the apertures of the mask onto the substrate. However, in the use of the mask to provide a desired metallic pattern some difficulty has been experienced. For example, in using very thin metal mask to minimize shadow effects caused by edges of apertures therein, such masks have a tendency not to lie flatly on the substrate. This tendency is frequently attributed to the existence of air or other gases between the mask and the substrate, and the buckling of the mask when heated in the depositing operation.

It is accordingly an object of this invention to provide novel methods of and apparatus for forming substances on preselected areas of substrates.

Another object of the invention is the provision of methods of and apparatus for depositing a film-forming metal on preselected areas of a flat surface of an insulating substrate, wherein a substantially two-dimensional resilient mask, having at least a portion thereof warped out of the plane of the flat surface, is forced against such flat surface prior to the deposition of the film-forming metal.

Methods of forming substances on preselected areas of substrates illustrating certain features of the invention may include positioning on the surface of a substrate a resilient mask having at least a portion thereof not in the plane of the surface of the substrate and having apertures therein conforming to the preselected areas of such surface. The resilient mask is then forced against the substrate to deform such mask so that the surface thereof adjacent the substrate moves into the plane of the surface of the substrate. Next, the substance to be formed on the surface of the substrate is deposited on the mask and through the apertures thereof onto the substrate. After the completion of such deposition, the force holding the mask against the substrate is released so that a portion of the mask moves out of the plane of the surface of the substrate. Then, the mask is removed from the substrate, thereby leaving the substance on preselected areas of the substrate.

Apparatus for forming substances on preselected areas of substrates illustrating certain features of the invention may include a resilient mask positioned on the surface of a substrate. The mask has at least a portion thereof not in the plane of the surface of the substrate and also has apertures therein conforming to the preselected areas of the surface of the substrate. Means are provided for forcing the resilient mask against the substrate to deform such mask so that the surface thereof adjacent the substrate moves into the plane of the surface of the substrate. Means are also provided for depositing the substance on the mask and through the apertures thereof onto the substrate. After the substance is so deposited, the forcing means are released so that a portion of the mask moves out of the plane of the surface of the substrate. Upon removal of the mask from the substrate, the substance remains on the preselected areas of the surface of the substrate.

A more complete understanding of the invention may be obtained from the following detailed description of methods and apparatus forming specific embodiments of the invention when read in conjunction with the appended drawings wherein.

Figures 1, 2:
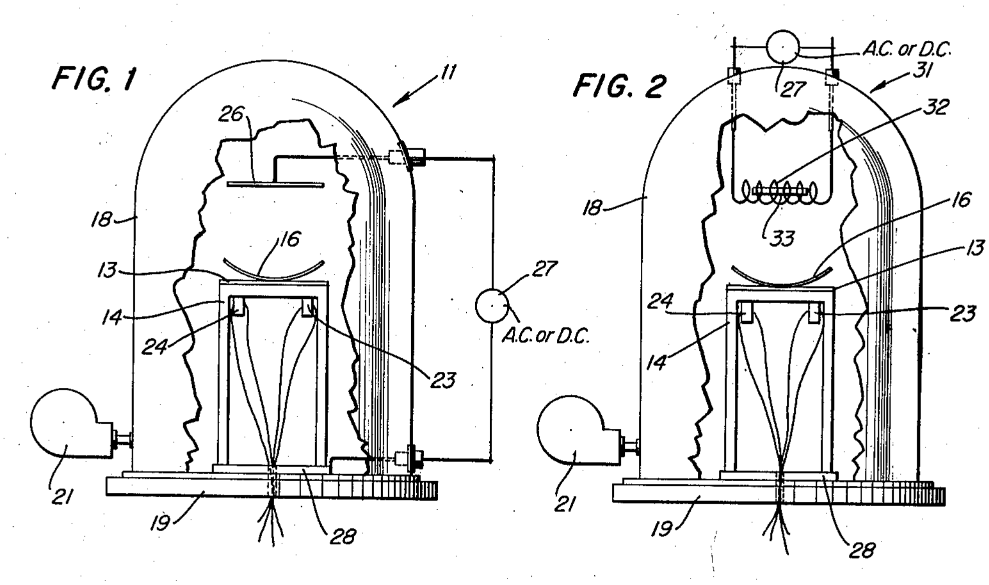
FIG. 1 is a schematic front elevational view of an apparatus suitable for producing a film of metal by cathodic sputtering in accordance with the present invention.
FIG. 2 is a schematic front elevational view of an apparatus suitable for producing a film of metal by vacuum evaporation in accordance with the present invention.

Although metal films formed on substrates in accordance with the present invention are essentially two-dimensional, they have been illustrated in some figures on drawings as three-dimensional to illustrate more clearly the methods and apparatus of the present invention. Also, the relative dimensions of the drawing have often been distorted to more clearly illustrate the invention.

Figure 3:
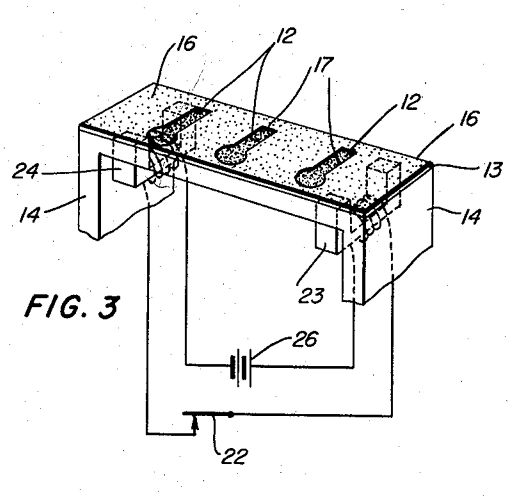
FIG. 3 is a perspective view of a portion of the apparatus of FIGS. 1 and 2 showing the position of a mask on a substrate during a cathodic sputtering or vacuum evaporating operation.
Figure 4:
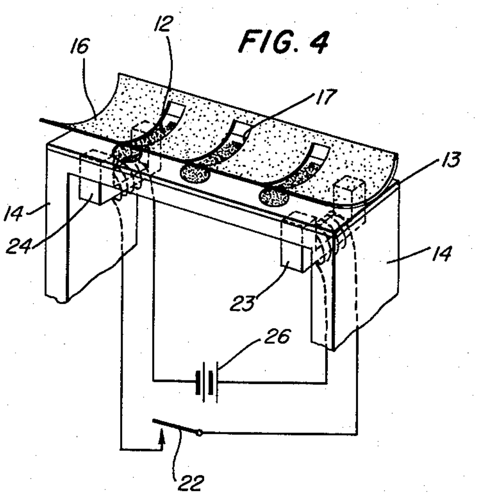
FIG. 4 is a perspective view of a portion of the apparatus of FIGS. 1 and 2 after the completion of a cathodic sputtering or vacuum evaporating operation and showing the mask having a portion thereof out of the plane of the surface of the substrate which has been selectively coated.
Figure 5:
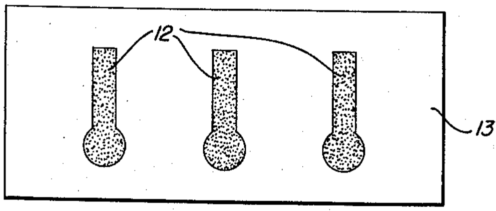
FIG. 5 is a plane view of an insulating substrate having an electrically conductive metal film thereon.

Referring now to FIG. 1, there is shown a cathodic sputtering apparatus, designated generally by the numeral 11, for forming or depositing a substance 12, FIGS. 3–5, on preselected areas of a substrate 13. In the event that the methods and apparatus of the present invention are to be used for fabricating printed circuit components for use in microcircuitry—a purpose for which they are particularly well suited—the substrate 13 is composed of an insulating material having a smooth surface which is completely free from sharp changes in contour. In general, the substrates set forth in R. W. Berry Patent 2,993,266 and co-pending application, Serial No. 94,543, filed March 9, 1961, by D. A. McLean and D. S. Nicodemus are suitable for use in practicing the invention. More particularly, most types of vitreous material, such as glass, ceramics, or the like, are suitable substrates.

The substrate 13 is placed on a platform 14 located within the sputtering apparatus 11.

Positioned on the surface of the substrate 13 is a resilient substantially two-dimensional mask 16 having at least a portion thereof not in the plane of such surface. Typically, the mask 16 is composed of a magnetic, paramagnetic or ferromagnetic material, such as spring steel or the like, and is pre-buckled so that when such mask 16 is positioned on the substrate 13, a portion of the mask 14 is warped out of the plane of the surface of the substrate 13. Ideally, the mask 14 is made from a sheet of spring steel having a thickness in the range of about 3 mils up to about 30 mils. Due to the fact that the mask 16 is pre-buckled, such mask 16 is easy to handle. That is, the mask 16 may readily be picked up by hand or tweezers (not shown) and accurately positioned on the substrate 13. Moreover, if the mask 16 is composed of a paramagnetic material, such mask 16 may be accurately positioned on the substrate 13 by an electromagnet (not shown).

To restrict the formation of the substance 12 to preselected areas of the substrate 13, the mask 14 is provided with a plurality of apertures 17, FIGS. 3 and 4, conforming to such preselected areas.

After the mask 16 is positioned on the substrate 13, the region surrounding the mask 16 and the substrate 13, which is enclosed by a vacuum chamber 18 and a support 19, is evacuated by a pump 21 to remove most of the air or other gases existing between the mask 16 and the substrate 13. The removal is greatly facilitated by the fact that the mask 16 is warped out of the plane of the substrate 13.

After such removal, a switch 22, FIG. 3, is closed to establish an energizing circuit for electromagnets 23 and 24, which are fixed to platform 14. Such circuit may be traced from switch 22, electromagnet 23, battery 25 and electromagnet 24 back to switch 22.

Energization of electromagnets 23 and 24 establishes a magnetic field which attracts and forces the mask 16 against the substrate to deform such mask 16 so that the surface thereof adjacent the substrate 13 moves into the plane of the surface thereof. Inasmuch as most of the gas between the substrate 13 and the mask 16 has been removed, the mask 16 lies very flatly against the substrate 13 to minimize any shadow effects caused by the apertures 17 of such mask 16.

The sputtering apparatus 11 includes a cathode 26 which is composed of an electrically conductive metal. If apparatus 11 is to be used for fabricating printed circuit components for use in microcircuitry, preferably the cathode is a film-forming metal, as disclosed in R. W. Berry Patent 2,993,266. Metals subject to anodization, such as metals selected from the group including tantalum, tungsten, aluminum, niobium, titanium, hafnium and zirconium are particularly suitable for use in microcircuitry. In addition highly conductive metals, such as gold or the like, are frequently used in microcircutry. Metals with low vapor pressure, such as tantalum and niobium, are most satisfactorily deposited with the sputtering apparatus 11, in which case the cathode 26 is made from such metals. The cathode 26 is connected to a source of potentials 27.

Located beneath the platform 14 and fixed to a support 19 is an anode 28, which is electrically positive with respect to cathode 26.

By employing a proper source 27, pressure within the chamber 18 (which may be flushed with an inert gas prior to evacuation), and relative positions of the cathode 26, anode 28 and the substrate 13 within the chamber 18, as disclosed in R. W. Berry Patent 2,993,266, a layer of the substance 12 is formed or deposited from the cathode 26 on preselected areas of the upper surface of the substrate 13. The sputtering is conducted for a period of time calculated to produce the desired thickness of the layer of the substance 12. Even though the thin, resilient mask 16 is heated during the sputtering, such mask 16 does not buckle, but remains flatly in the plane of the surface of the substrate 13 because of the holding force of electromagnets 23 and 24.

After the completion of the sputtering, the vacuum of chamber 18 is relieved and switch 22 is opened. Opening of switch 22 results in the de-energization of electromagnets 23 and 24 and the release of the holding force of the mask 16. Release of such force from the mask 16 permits the mask 16 to assume its pre-buckled condition, FIG. 4, and to move out of the plane of the surface of the substrate 13. Therefore, the mask 16 may very easily be removed by hand, tweezers or electromagnetic means (not shown) from the substrate 13.

Thus, since the mask 16 was forced against the substrate 13 during the sputtering process, very sharply defined formations or deposits of the substance 12 on the substrate 13 have been produced by apparatus 11.

Referring to FIG. 2, there is shown a vacuum evaporating apparatus, designated generally by the numeral 31, which may also be used for forming or depositing the substance 12, FIGS. 3–5, on preselected areas of the substrate 13. Such vacuum evaporating apparatus 31, as shown and described in detail in R. W. Berry Patent 2,993,266, is particularly suitable for depositing metals having high vapor pressures, for example aluminum and titanium. Furthermore, such apparatus 31 is also very suitable for forming or depositing gold films on insulating substrates for use in the methods set forth in co-pending application, Serial No. 150,809, filed November 7, 1961, by J. W. Balde, W. E. Dewey and H. M. Pepiot.

The vacuum evaporating apparatus 31 is similar to the cathodic sputtering apparatus except that in place of cathode 26 and anode 28, there is a filament 32 for heating a metal slug 33 to be evaporated through the apertures 17 of the mask 16 onto the substrate 13. Connected to the filament 32 is a source of potential 27 for supplying current to such filament 32 to thereby control the temperature to which the slug 33 is heated by such filament 32.

Inasmuch as the details, such as pressure, voltage and the like, of the vacuum evaporating apparatus 31 are well known (see R. W. Berry Patent 2,993,266) such details are not set forth herein.

The same procedure of evacuating the chamber 18 by the pump 21, energizing magnets 23 and 24 to flatten the mask 16 against the substrate 13, depositing the substance 12, relieving the vacuum chamber 18, deenergizing the electromagnets 23 and 24, and removing of the mask 16, which was used with the cathodic sputtering apparatus 11, is also used with the vacuum evaporating apparatus 31 to form or deposit the substance 12 on the substrate 13.

It should be understood that the above-described embodiments of this invention are merely illustrative and that numerous modifications may be made within the spirit and scope of this invention. For example, the substantially two-dimensional pre-buckled resilient mask 16 may be used for coating preselected areas of a substrate with any of numerous different substances, whether they be paint, waxes, greases, etc. Specifically, such mask could be used to very accurately and conveniently mask wax on preselected areas of a tantalum or gold film, in accordance with the methods set forth in the aforementioned co-pending application, Serial No. 150,809.

Furthermore, the substance 12 may be deposited by methods other than cathodic sputtering or vacuum evaporating. More particularly, such substance could very easily be sprayed, applied by a brush or roller onto the mask and through the apertures thereof onto the substrate.

What is claimed is:

1. The method of coating selected areas of a substrate with a coating material, which method comprises:

forming a sheet of relatively thin, resilient, magnetic material into a mask of a desired pattern for masking a surface of a substrate and exposing only selected areas of the substrate surface to be coated;

buckling the thus-formed mask to deform the same permanently to an extent such that, when the buckled mask is placed on the surface of the substrate, a major portion of the opposed surface of the mask is warped out of the plane of the substrate surface;

placing the buckled mask on the substrate surface;

producing magnetic coercive forces tending to urge the mask against the substrate surface so that the mask is forced into a condition such that its opposed surface lies wholly in the plane of and is pressed firmly against the substrate surface;

depositing the coating material onto the exposed portions of the substrate material; and removing the magnetic coercive forces to permit the resilient mask to spring back to its deformed condition, thereby facilitating the removal of the mask from the coated substrate surface.

2. The method according to claim 1 including the step of evacuating the space surrounding the substrate and the buckled mask after the latter has been placed on the substrate surface and prior to the producing of the magnetic coercive forces so as to minimize the entrapment of gases between the substrate surface and the opposed surface of the mask.

3. Apparatus for coating selected areas of a substantially flat substrate surface with a coating material, which apparatus comprises:

a mask of a predetermined pattern for masking a surface of a substrate and exposing selected areas of the substrate surface to be coated, said mask being formed of a relatively thin sheet of resilient, magnetic material and permanently deformed into a bowed configuration such that when the mask is placed on the flat surface of the substrate a major portion of the opposed surface of the mask is warped out of the plane of the substrate surface; and magnetic means positioned adjacent to the substrate surface for creating a magnetic field through the magnetic material of the mask in a direction and of a strength such that magnetic coercive forces are produced tending to urge the mask against the substrate surface so as to force the same into a condition such that the opposed surface of the mask lies wholly in the plane of and pressed against the substrate surface.

4. Apparatus according to claim 3 wherein the mask is bowed to the extent that said opposed surface thereof normally makes essentially line contact with the surface of the substrate when placed thereon.

5. Apparatus according to claim 3 wherein said magnetic means comprises at least one electromagnet positioned subadjacent the substrate surface.

References Cited in the file of this patent

UNITED STATES PATENTS

| | | |
|---|---|---|
| 2,453,582 | Morgan | Nov. 9, 1948 |
| 2,463,906 | Pride | Mar. 8, 1949 |
| 2,891,880 | Nakken | June 23, 1959 |